US012665166B2

(12) United States Patent
Kamath et al.

(10) Patent No.: US 12,665,166 B2
(45) Date of Patent: Jun. 23, 2026

(54) PROCESS CHAMBER AND PROCESS KITS FOR ADVANCED PACKAGING

(71) Applicant: Applied Materials, Inc., Santa Clara, CA (US)

(72) Inventors: Aravind Miyar Kamath, San Jose, CA (US); Cheng-Hsiung Matthew Tsai, Cupertino, CA (US); Manjunatha Koppa, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 596 days.

(21) Appl. No.: 17/704,840

(22) Filed: Mar. 25, 2022

(65) Prior Publication Data

US 2023/0307211 A1 Sep. 28, 2023

(51) Int. Cl.
*H01J 37/32* (2006.01)
*H01J 37/20* (2006.01)

(52) U.S. Cl.
CPC ........ *H01J 37/32009* (2013.01); *H01J 37/20* (2013.01); *H01J 2237/20* (2013.01); *H01J 2237/3321* (2013.01)

(58) Field of Classification Search
CPC ................ H01J 37/32009; H01J 37/20; H01J 2237/3321; H01J 2237/20; H01J 2237/332–3348
USPC ................... 118/715–733; 156/345.1–345.55
See application file for complete search history.

(56) References Cited

U.S. PATENT DOCUMENTS 8,647,485 B2  2/2014 Rasheed et al.
8,920,564 B2 * 12/2014 Tzu ..................... C23C 16/4585
                                                                   118/724

9,682,398 B2 * 6/2017 Ranish .................... C30B 35/00
9,834,840 B2  12/2017 Rasheed et al.
9,953,812 B2  4/2018 Johanson et al.
2008/0178801 A1 * 7/2008 Pavloff ............. H01J 37/32477
                                                                   118/504
2011/0186426 A1 * 8/2011 Hawrylchak ......... C23C 14/564
                                                                   204/298.11

(Continued)

FOREIGN PATENT DOCUMENTS

CN       214753696 U    11/2021
WO     2022055736 A1    3/2022

OTHER PUBLICATIONS

"PCT International Search Report and Written Opinion in PCT/US2023/016228 dated Jul. 13, 2023, 10 pages".

*Primary Examiner* — Charlee J. C. Bennett

(74) *Attorney, Agent, or Firm* — Servilla Whitney LLC

(57) ABSTRACT

Process kits for processing chambers and processing chambers having a lower shield and lower shield ring are described. The lower shield has a ring-shaped body with an inner wall and an outer wall, a top wall and a bottom wall with an outer ledge wall extends outwardly from a lower portion of the outer wall to an outer ledge outer wall. The lower shield ring has a ramped lower inner wall with a top face spaced a distance from the bottom face of the upper inner wall so that the distance decreases from the lower inner wall to an inside surface of the outer wall. At least one upper opening extends through the top portion of the lower shield ring and at least one opening extends through the lower portion of the lower shield ring. Upper shields configured to cooperatively interact with the lower shield and lower shield ring are also described.

19 Claims, 8 Drawing Sheets

(56)  References Cited

U.S. PATENT DOCUMENTS

| 2012/0003388 A1* | 1/2012 | Tzu ................... C23C 16/45565 |
| | | 118/58 |
| 2012/0103257 A1* | 5/2012 | Rasheed ............. C23C 14/3407 |
| | | 118/500 |
| 2014/0262026 A1 | 9/2014 | Forster et al. |
| 2015/0162170 A1* | 6/2015 | Kishi ................ H01J 37/32642 |
| | | 156/345.1 |
| 2016/0189936 A1* | 6/2016 | Chia ................. C23C 16/45565 |
| | | 156/345.33 |
| 2017/0002461 A1 | 1/2017 | Johanson et al. |
| 2017/0330769 A1 | 11/2017 | She et al. |
| 2018/0130644 A1 | 5/2018 | Chia et al. |
| 2018/0151337 A1 | 5/2018 | Nguyen et al. |
| 2019/0153592 A1 | 5/2019 | Bois et al. |
| 2021/0066050 A1 | 3/2021 | Babu et al. |
| 2021/0066051 A1 | 3/2021 | Babu et al. |
| 2021/0130953 A1 | 5/2021 | Mustafa et al. |

* cited by examiner

PROCESS CHAMBER AND PROCESS KITS FOR ADVANCED PACKAGING

TECHNICAL FIELD

Embodiments of the disclosure generally relate to process kits and process chambers. In particular, embodiments of disclosure relate to process kits for advanced packaging process chambers using a two-component lower shield.

BACKGROUND

Currently, capacitively coupled plasma (CCP) physical vapor deposition (PVD) chambers are not compatible with existing advanced packaging platforms. The disclosure provides process chambers that can be incorporated into advanced packaging processing platforms, e.g., the Endura® platform from Applied Materials, Inc.

Traditional process chambers are limited to standard PVD technologies. The process chamber body incorporates a shutter garage, with minimal other changes to the overall footprint of the chamber. This allows for the incorporation of ionized PVD technologies into the cluster tool environment.

Accordingly, there is an ongoing need in the art for improved hard masks and methods of forming hard masks.

SUMMARY

One or more embodiments of the disclosure are directed to process kits for processing chambers. A lower shield has a ring-shaped body with an inner wall and an outer wall defining a lower shield wall thickness. A wall and a bottom wall define a lower shield height. An outer ledge wall extends outwardly form a lower portion of the outer wall to an outer ledge outer wall. A lower shield ring has a ring-shaped body with an outer wall and an upper inner wall defining a lower shield ring wall thickness. A top face and a bottom face of the upper inner wall define a lower shield ring upper height. A ramped lower inner wall has a top face and a bottom face. The top face of the ramped lower inner wall spaced a distance from the bottom face of the upper inner wall so that the distance decreases from a lower inner wall to an inside surface of the outer wall. At least one upper opening extends from the top face of the lower shield ring to the upper inner wall bottom face. At least one lower opening extends from the top face of the ramped lower inner wall to the bottom face of the ramped lower inner wall.

Some embodiments of the disclosure are directed to processing chambers incorporating a process kit. The process kit lower shield has a ring-shaped body with an inner wall and an outer wall defining a lower shield wall thickness. A wall and a bottom wall define a lower shield height. An outer ledge wall extends outwardly form a lower portion of the outer wall to an outer ledge outer wall. A lower shield ring has a ring-shaped body with an outer wall and an upper inner wall defining a lower shield ring wall thickness. A top face and a bottom face of the upper inner wall define a lower shield ring upper height. A ramped lower inner wall has a top face and a bottom face. The top face of the ramped lower inner wall spaced a distance from the bottom face of the upper inner wall so that the distance decreases from a lower inner wall to an inside surface of the outer wall. At least one upper opening extends from the top face of the lower shield ring to the upper inner wall bottom face. At least one lower opening extends from the top face of the ramped lower inner wall to the bottom face of the ramped lower inner wall.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
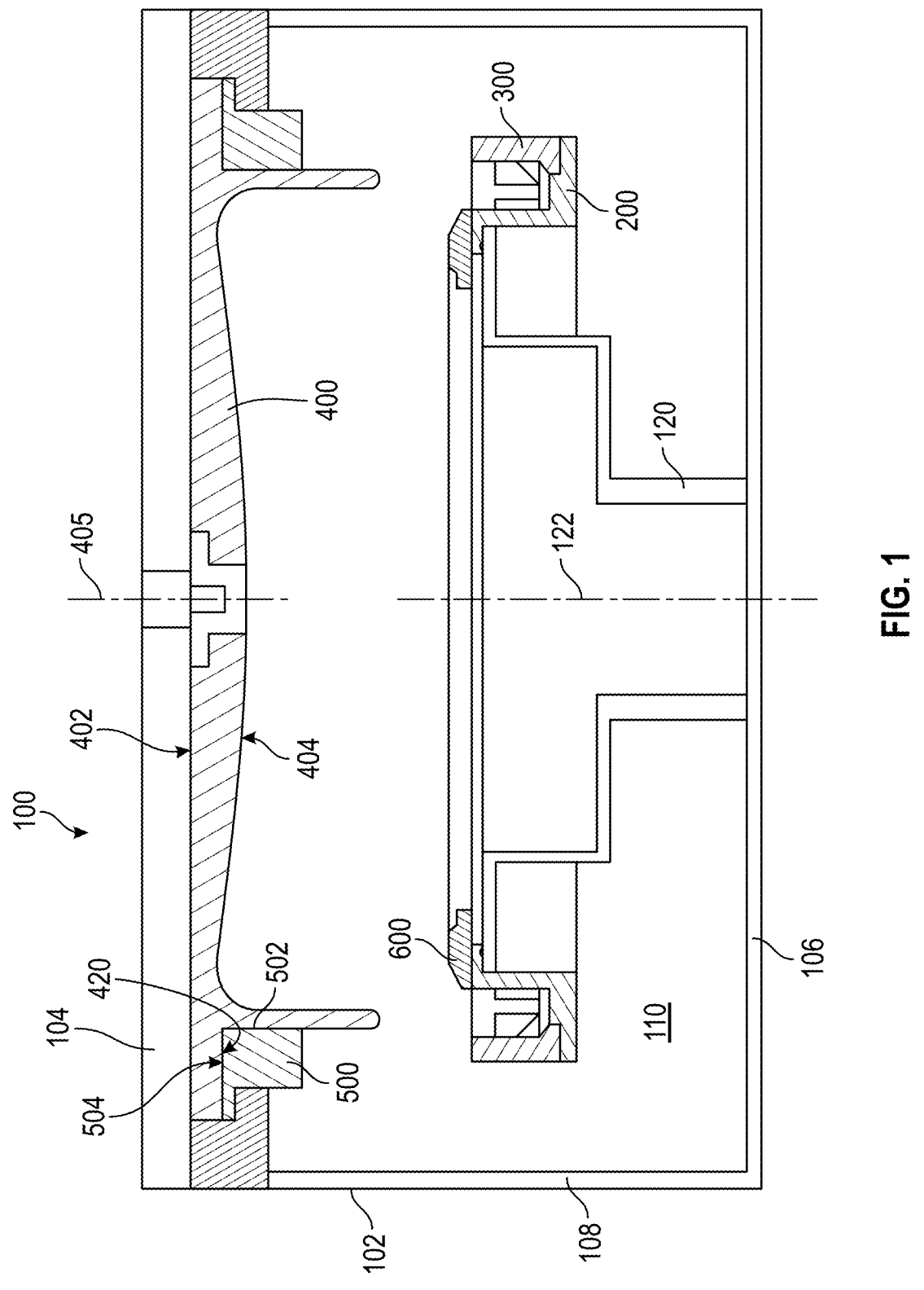
FIG. 1 shows a schematic cross-sectional view of a processing chamber according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments of the disclosure incorporate one or more of 1) high-temp e-chuck for wafer temperature control with ability to have dual RF feed 2) VHF shield to contain the plasma in process cavity 3) remote plasma source (RPS) on CCP architecture; 4) and/or chamber architecture with a $H_2$ and $O_2$ gas box in the single chamber, which allows both $H_2$ and $O_2$ gases to be used in the same chamber, either simultaneously or not. In some embodiments, dual RF with high temperature is advantageously used for certain processes related to cleaning and etching. Some embodiments improve one or more of plasma leakage containment, VHF shielding and process spacing.

The high temperature e-chuck of some embodiments enables low wafer temperature at end of the etch process.

The CCP of some embodiments allows for aluminum pasting for long kit life and superior defect performance for adv. packaging applications. The CCP of some embodiments increases the process kit lifetime for metal etch applications.

The integrated shutter garage allows for the incorporation of, or connection with, a pre-clean chamber.

Embodiments of the disclosure provide process chambers with improved process kit lifetimes. Some embodiments provide process chambers that use a high-temperature electrostatic chuck which has an RF capability with improved bipolar chucking. The echuck of some embodiments enabled wafer temperature control during etching.

In some embodiments, the process kit includes a lower shield designed to provide improved conductance and plasma containment for VHF power.

Plasma exposure to the process chamber surfaces can cause damage and particulate formation. The lower shield of some embodiments incorporates a labyrinthine passage that prevents plasma propagation outside of the process region.

The lower shield of some embodiments has gaps to improve the overall gas conductance while preventing plasma propagation.

The lower shield of some embodiments is split into two components: a lower shield and a lower shield ring. This reduces overall manufacturing costs while maintaining performance characteristics.

Referring to FIG. 1, one or more embodiments of the disclosure are directed to process kits for processing chambers 100. As used in this manner, a "process kit" refers to one or more components of a processing chamber that are readily changeable or replaceable. For example, process kits include, but are not limited to, shields and grounding components. The embodiment illustrated in FIG. 1 includes a lower shield 200, a lower shield ring 300, an upper shield 400, a grounding ring 500 and a support ring 600.

The processing chamber 100 includes chamber body 102 with a top wall 104, a bottom wall 106 and a sidewall 108 enclosing an interior volume 110. A substrate support pedestal 120 is located within the interior volume 110. The substrate support pedestal 120 of some embodiments is configured to move vertically (i.e., closer to or further from the top wall 104) within the interior volume and/or to rotate around a central axis 122 of the substrate support pedestal 120 within the interior volume 110. The skilled artisan will be familiar with components which can be used to move the substrate support pedestal including, for example, motors, switches, actuators and appropriate circuitry.

The substrate support pedestal 120 of some embodiments comprises one or more of a heater or an electrostatic chuck. Heater and electrostatic chuck components are now shown in FIG. 1. However, the skilled artisan will be familiar with the components of a heater and/or electrostatic chuck.

Figure 2:
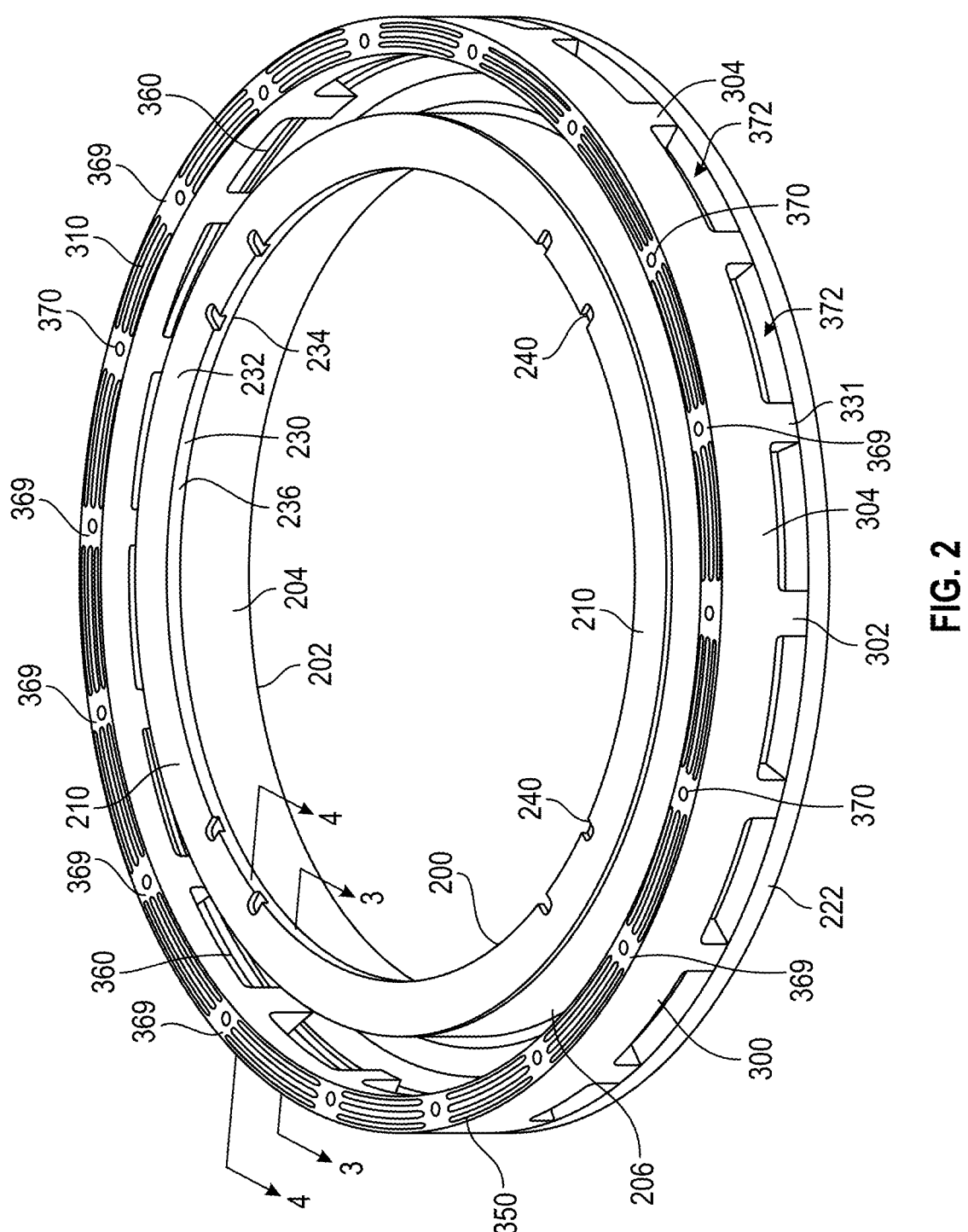
FIG. 2 shows an isometric view of a lower shield and lower shield ring according to one or more embodiment of the disclosure.
Figure 3:
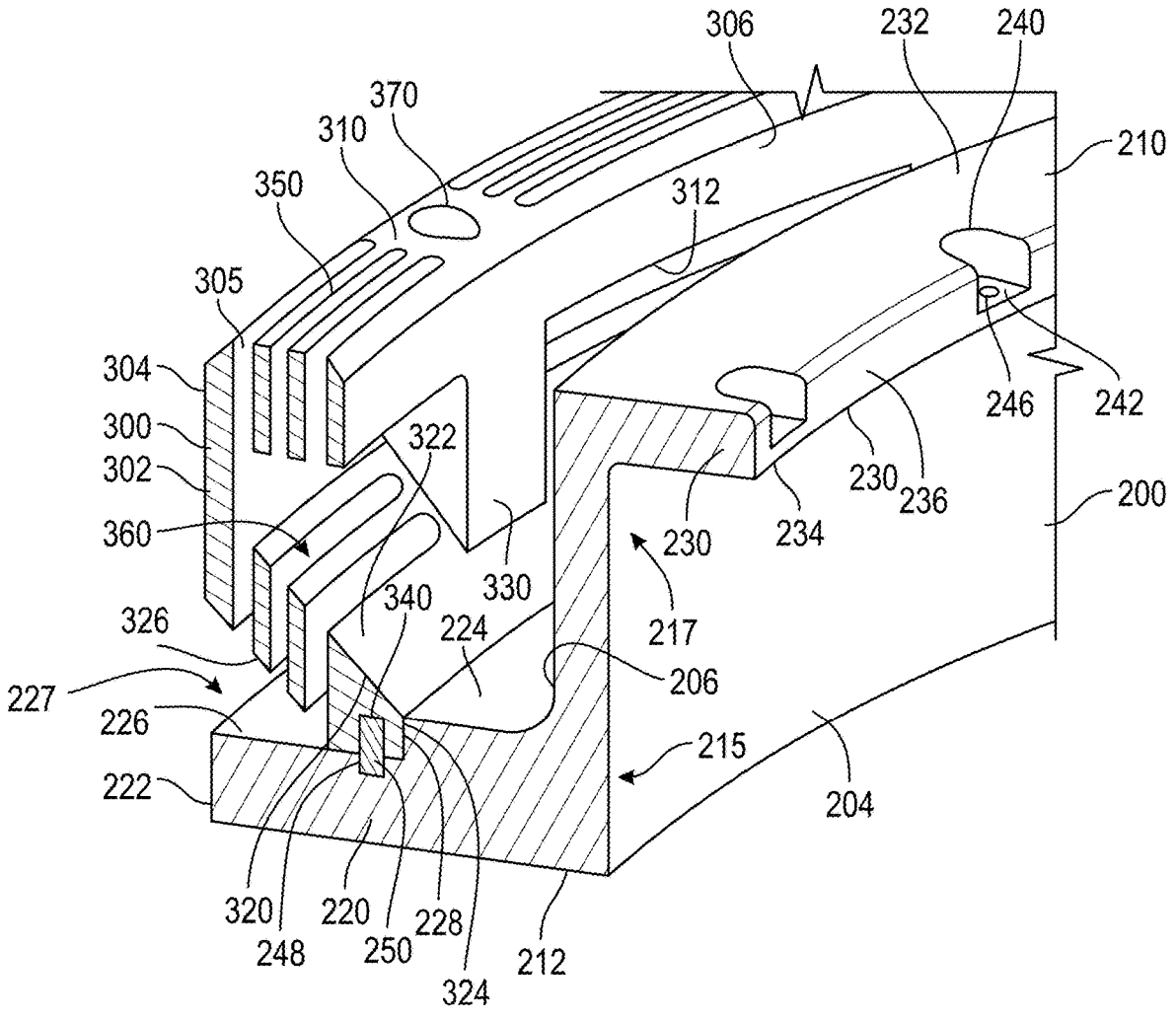
FIG. 3 shows a partial cross-sectional view of the lower shield and lower shield ring of FIG. 2 taken along line 3-3.
Figure 3A:
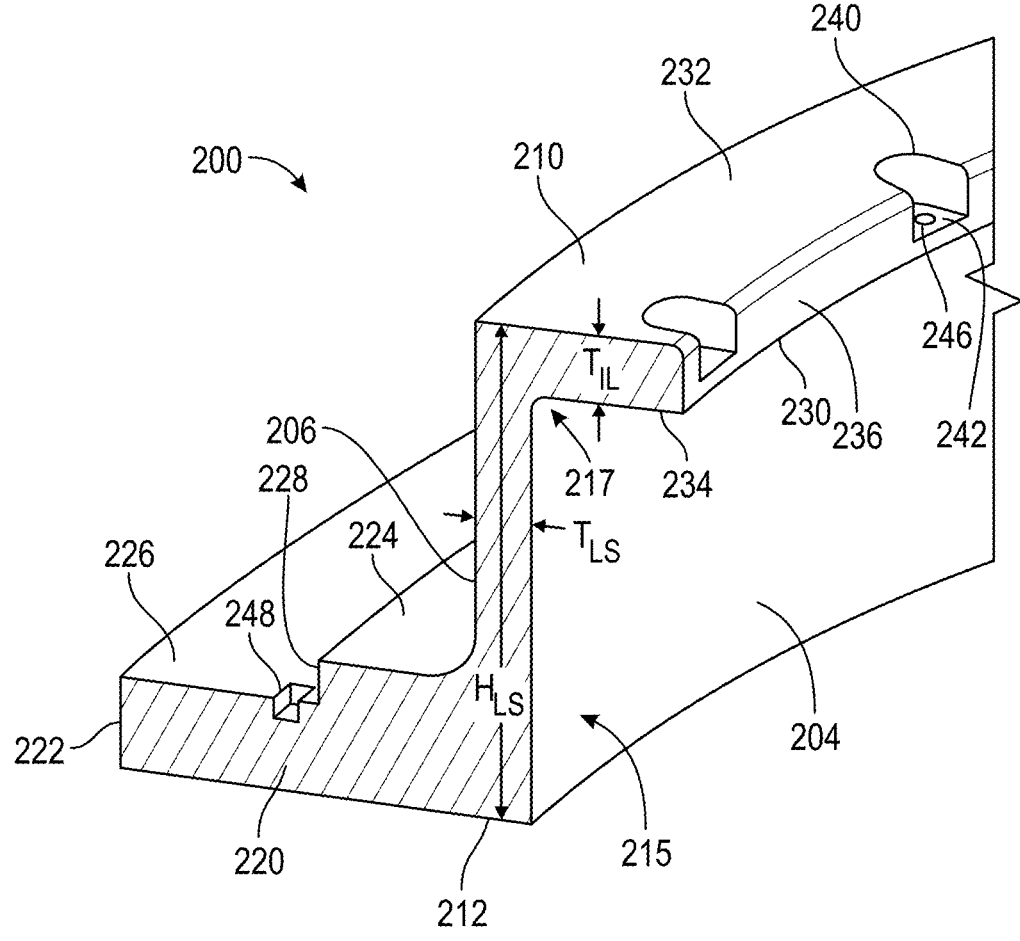
FIG. 3A shows a partial cross-sectional view of the lower shield of FIG. 3.
Figure 3B:
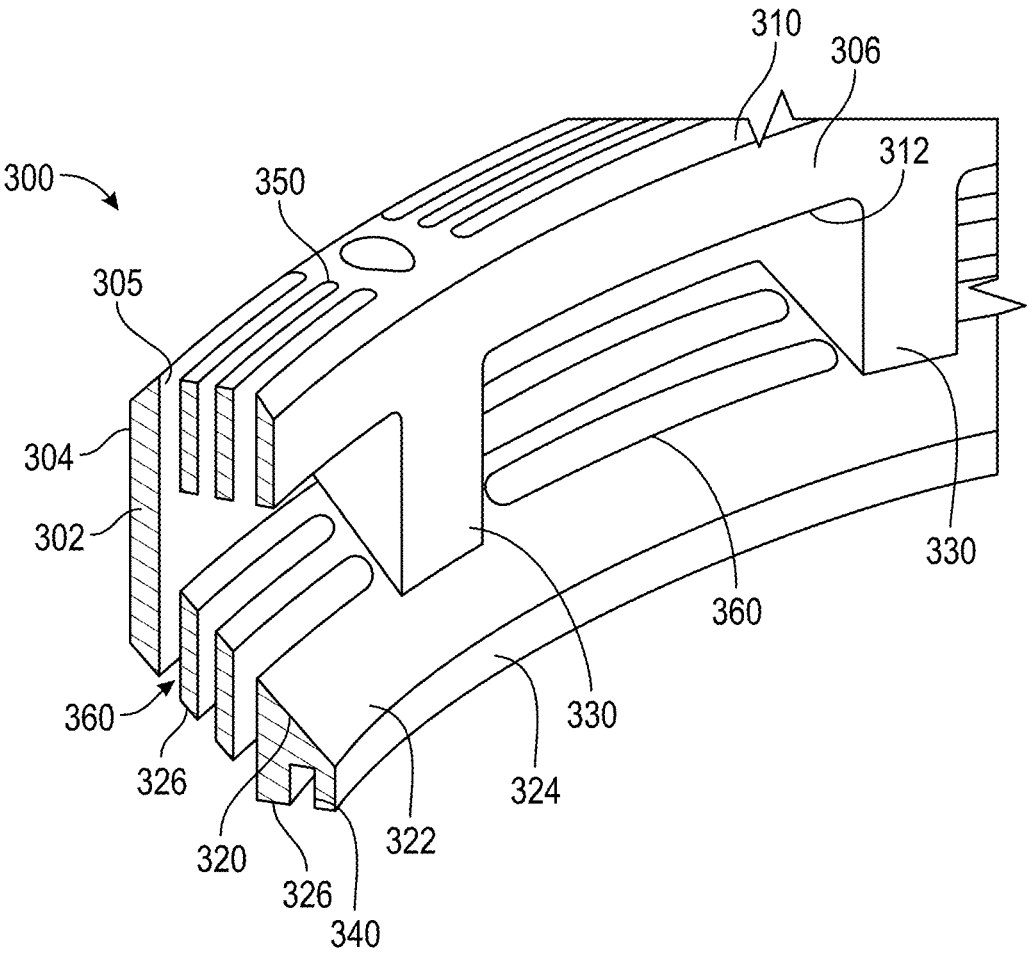
FIG. 3B shows a partial cross-sectional view of the lower shield ring of FIG. 3.
Figure 4:
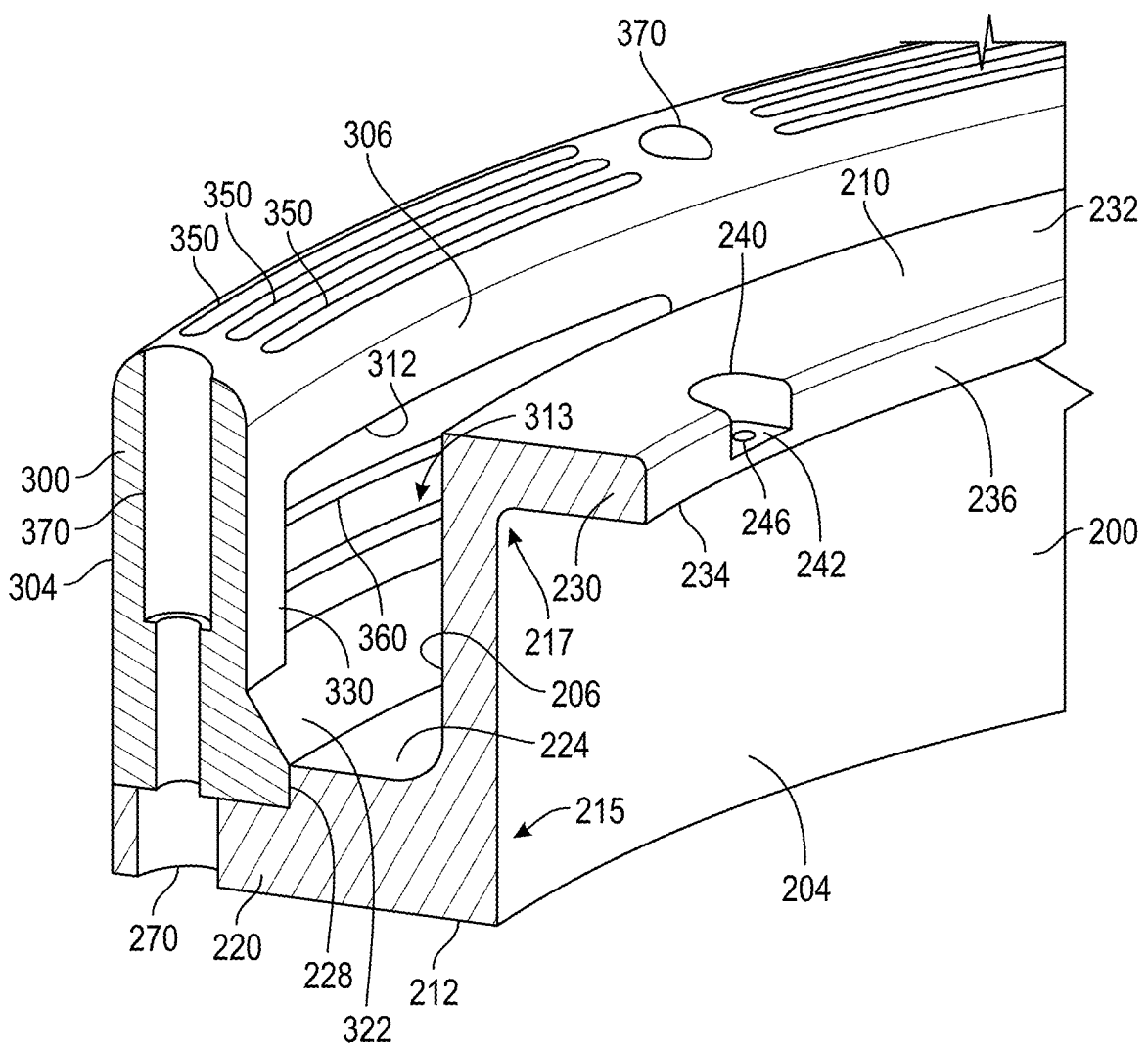
FIG. 4 shows a partial cross-sectional view of the lower shield and lower shield ring of FIG. 2 taken along line 4-4.

Referring to FIGS. 2 through 4, one or more embodiments of the disclosure are directed to a lower shield 200 and/or a lower shield ring 300. FIG. 2 shows an orthographic view of a lower shield 200 and lower shield ring 300. FIG. 3 shows a partial cross-sectional view of the lower shield 200 and lower shield ring 300 taken along line 3-3 of FIG. 2. FIGS. 3A and 3B show the lower shield 200 and lower shield ring 300, respectively, of FIG. 3. FIG. 4 shows a partial cross-sectional view of the lower shield 200 and lower shield ring 300 taken along line 4-4 of FIG. 2.

FIG. 3 shows the cross-section taken through the plurality of openings in the lower shield ring 300, as described below. This view shows the appearance of vanes formed by the openings to allow gas to flow through the lower shield ring 300. FIG. 4 shows the cross-section taken through aligned openings in the lower shield 200 and lower shield ring 300 to allow a fastener to connect the lower shield 200 and lower shield ring 300 together.

The lower shield 200 has a ring-shaped body 202 with an inner wall 204 and an outer wall 206 that define a lower shield wall thickness TLS. A top wall 210 and a bottom wall 212 define a lower shield height HLS. An outer ledge wall 220 extends outwardly from a lower portion 215 of the outer wall 206 to an outer ledge outer wall 222.

The outer ledge wall 220 of some embodiments has a uniform top surface. In the illustrated embodiment, the outer ledge wall 220 has a stepped top surface forming an outer ledge upper top face 224 and an outer ledge lower top face 226 separated by an outer ledge intermediate outer wall 228. The slope of the outer ledge intermediate outer wall 228 can be any suitable slope forming either a perpendicular wall (as shown) or an acute or obtuse angle. The outer ledge intermediate outer wall 228 of some embodiments provides a contact point for the lower shield ring 300.

In some embodiments, an inner ledge 230 extends a distance inwardly from an upper portion 217 of the inner wall 204 of the lower shield 200. The inner ledge 230 forms an inner ledge top face 232, and inner ledge bottom face 234 and an inner ledge inner face 236. The inner ledge top face 232 and inner ledge bottom face 234 define a thickness $T_{IL}$ of the inner ledge 230.

The inner ledge top face 232 of some embodiments comprises a plurality of recesses 240 extending from the inner ledge top face 232 to a recess top face 242. In some embodiments, a hole 246 extends through the thickness of the inner ledge 230, or as shown, through the thickness of the inner ledge 230 between the recess top face 242 and the inner ledge bottom face 234. The recess 240 and hole 246 provide a suitable location where a fastener can be used to connect the lower shield 200 to another component. For example, the lower shield 200 of some embodiments is configured to be connected to a substrate support 120.

The lower shield ring 300 is configured to be connected to the lower shield 200. Any suitable connection or interface known to the skilled artisan can be used. For example, in the embodiment illustrated, the outer ledge lower top face 226 of the lower shield 200 has a recess 248 which can cooperatively interact with one or more components of the lower shield ring 300 to connect the lower shield 200 and lower shield ring 300 in a fixed, but removable, manner.

The lower shield ring 300 has a ring-shaped body 302 with an outer wall 304 and an upper inner wall 306 defining a lower shield ring wall thickness $T_{LSR}$. A top face 310 and a bottom face 312 define the thickness of the upper inner wall 306.

A ramped lower inner wall 320 is located at a bottom portion of the lower shield ring 300. The ramped lower inner wall 320 has a ramped lower inner wall top face 322 and a ramped lower outer wall bottom face 326 that define a thickness of the ramped lower inner wall 320. The ramped lower inner wall 320 is spaced a distance from the bottom face 312 of the upper inner wall 306 so that the distance decreases from the ramped lower inner wall top face 322 to an inside surface 305 of the outer wall 304.

In some embodiments, as shown in the Figures, an inner wall ramp connector face 330 extends from the upper inner wall 306 to the ramped lower inner wall 320. In some embodiments, the inner wall ramp connector face 330 forms a seamless connection to the upper inner wall 306 so that the upper inner wall 306 and inner wall ramp connector face 330 are a uniform shape.

In some embodiments, the bottom face 326 of the ramped lower inner wall 320 comprises a surface feature configured to align and/or connect the lower shield 200 with the lower shield ring 300. In the embodiment illustrated in FIG. 3, a recess 340 is formed in the bottom face 326 of the ramped lower inner wall 320. An alignment pin 250 can be positioned between the lower shield 200 and the lower shield ring 300 so that the recesses 248, 340 are aligned. In some embodiments, one of the recesses 248, 340 are a complementary protrusion instead of a recess. The complementary protrusion is configured to fit within the complementary recess of the other component. The skilled artisan will recognize that these are merely representative of possible alignment features and that other alignment features are within the scope of the disclosure.

In some embodiments, there is at least one upper opening 350 extending from the top face 310 of the lower shield ring 300 to the upper inner wall bottom face 312. In some embodiments, there are two upper openings 350 extending from the top face 310 of the lower shield ring 300 to the upper inner wall bottom face 312. In some embodiments, there are three upper openings 350 extending from the top face 310 of the lower shield ring 300 to the upper inner wall bottom face 312. In some embodiments, there are four upper openings 350 extending from the top face 310 of the lower shield ring 300 to the upper inner wall bottom face 312.

In some embodiments, there is at least one lower opening 360 extending from the top face 322 of the ramped lower inner wall 320 to the bottom face 326 of the ramped lower inner wall 320. In some embodiments there are two lower openings 360 extending from the top face 322 of the ramped lower inner wall 320 to the bottom face 326 of the ramped lower inner wall 320. In some embodiments there are three lower openings 360 extending from the top face 322 of the ramped lower inner wall 320 to the bottom face 326 of the ramped lower inner wall 320. In some embodiments there are four lower openings 360 extending from the top face 322 of the ramped lower inner wall 320 to the bottom face 326 of the ramped lower inner wall 320.

The upper openings 350 and the lower openings 360 are spaced between regions of the lower shield ring 300 where the inner wall ramp connector face 330 is positioned. These regions, also referred to as partitions 369, can include openings for fasteners to allow the lower shield 200 and lower shield ring 300 to be connected. In referring to at least one upper opening 350, and the like, the upper opening 350 extends between each of the partitions 369 around the outer portion of the wall, as shown in FIG. 2. For example, the embodiment of FIG. 2 has three upper openings 350 in the top surface 310 even though there are multiple sets of three opening regions between the partitions 369. For example, if there are 18 partitions 369, there will be 18 sets of three upper openings 350. This arrangement is referred to as having three openings, even though there are 54 separate upper openings 350 in three rows of 18 each.

In some embodiments, the bottom face 326 of the ramped lower inner wall 320 has an inner diameter that is smaller than the inner diameter of the upper inner wall 306.

In some embodiments, the recess 248 in the outer ledge lower top face 226 of the lower shield 200 is spaced a distance from the outer ledge intermediate outer wall 228 so that when the inner face 324 of the ramped lower inner wall 320 is in contact with the outer ledge intermediate outer wall 228 of the lower shield 200, the recess 248 in the outer ledge upper face 226 is aligned with the recess 340 in the bottom face 326 of the ramped lower inner wall 320 of the lower shield ring 300.

In some embodiments, when the lower shield 200 and lower shield ring 300 are assembled, the inner face 324 of the ramped lower inner wall 320 of the lower shield ring 300 is in contact with the outer ledge intermediate wall 228 of the lower shield 200, there is a gap 313 between the outer wall 206 of the lower shield 200 and the upper inner wall 306 of the lower shield ring 300. In some embodiments, when assembled, the bottom face 326 contacts the outer ledge top face 226 of the outer ledge 220 of the lower shield 200. In some embodiments, a gap 227 between the top face 226 of the outer ledge 220 and the bottom face 326 of the ramped lower inner wall 320 increases with increasing distance from the ramped lower inner wall 320 to the outer wall 304.

Referring to FIG. 4, in some embodiments, the lower shield 200 has an opening 270 in the outer ledge 220 aligned with an opening 370 in the lower shield ring 300. The aligned openings 270, 370 of some embodiments are configured to allow a fastener to be used to connect the lower shield 200 with the lower shield ring 300. As shown in FIG. 2, the opening 370 in the lower shield ring 300 is aligned with the outer portion surface 331 aligned with the inner wall ramp connector face 330. When viewed from outside the ring-shaped body 302, as shown in FIG. 2, the outer surface 304 appears to have a plurality of spaced openings 372 between the outer portion surfaces 331 of the outer wall 304.

Figure 5:
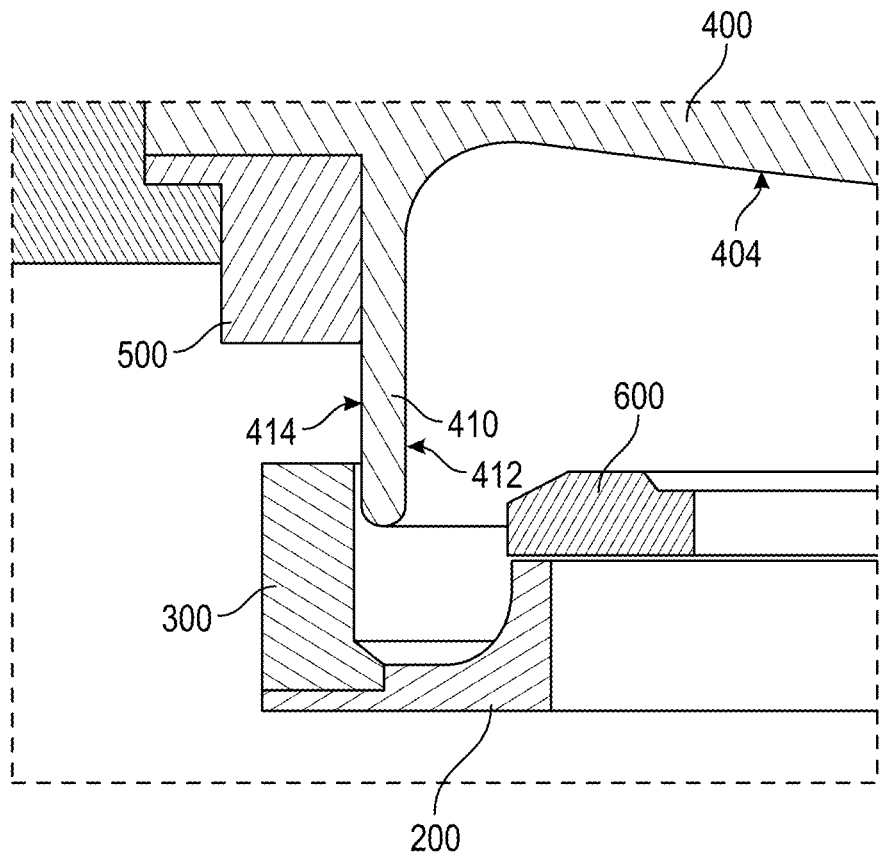
FIG. 5 shows a partial schematic cross-sectional view of a support ring according to one or more embodiment of the disclosure.

Referring to FIGS. 1 and 5, some embodiments of the processing chamber, or the process kit, include an upper shield 400 having a top surface 402 and a bottom surface 404. An upper shield ring 410 extends from the bottom surface 404 by a distance DUS. The upper shield ring 410 has an inside surface 412 and an outside surface 414 defining a thickness TUS of the upper shield ring 410. The inner surface 412 of the upper shield ring 410 has an inner diameter greater than the outer diameter of the outer wall 206 of the lower shield 200. The outer surface 414 of the upper shield ring 410 has an outer diameter smaller than the inner diameter of the upper inner wall 306 of the lower shield ring 300. In use, as shown in FIG. 5, the upper shield ring 410 fits into the gap between the outer wall 206 of the lower shield 200 and the upper inner wall 306 of the lower shield ring 300. This arrangement creates a torturous path for a gas flowing from the center of the process region to outside the lower shield ring 300.

In some embodiments, the bottom surface 404 of the upper shield 400 within the inner diameter of the upper shield ring 410 has a contoured shape so that the thickness of the upper shield changes. In some embodiments, the thickness of the upper shield 400 is greater at a center 405 of the upper shield 400 than at a position in the range of 50% to 90% of the distance between the center 405 of the upper shield 400 and the inner wall 412 of the upper shield ring 410.

Some embodiments of the process kit, or process chamber, include a grounding ring 500. The grounding ring 500 has an inner surface 502 with an inner diameter greater than the outer diameter of the upper shield ring 410. The grounding ring 500 has a top surface 504 configured to connect to the bottom surface 420 of the upper shield 400 outside the outer diameter of the upper shield ring 410.

In use, the spacing between the various surfaces can affect the flow characteristics of a gas leaving the process region of the process chamber. The process region of the process chamber is defined as the region above the substrate support surface within the bounds of the support ring 600. For example, in some embodiments, the ratio of the overlap between the lower shield and lower shield ring to the gap 313 between the upper inner wall 306 of the lower shield ring and the outer wall 206 lower shield 200 may be in the range of 5:1 to 10:1.

Figure 6:
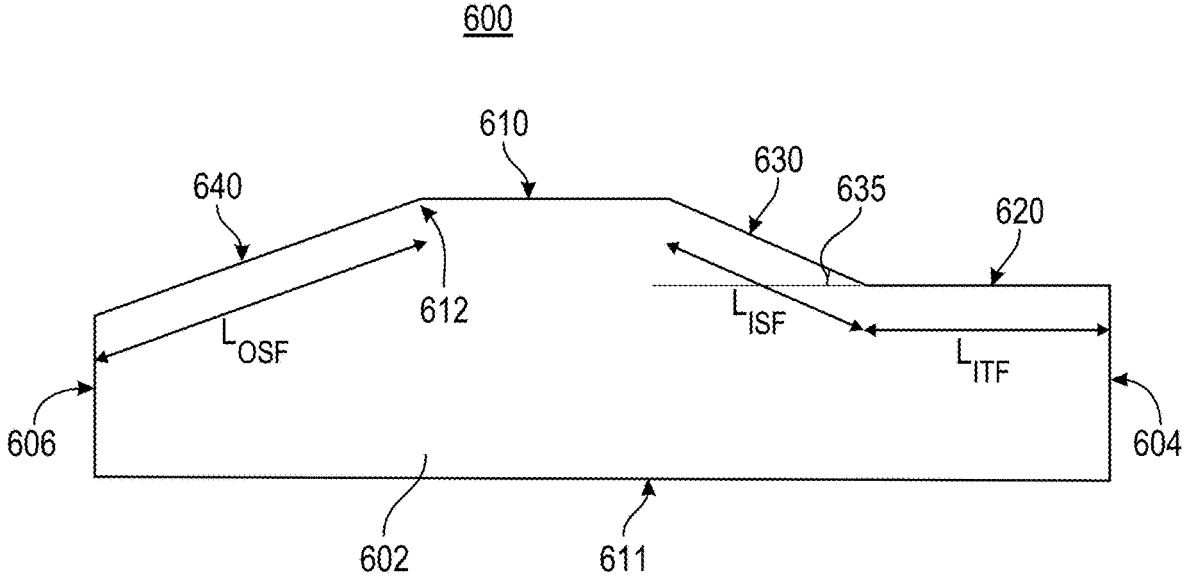
FIG. 6 shows a partial schematic cross-sectional view of a lower shield, lower shield ring and upper shield in a process position according to one or more embodiments of the disclosure.

Additional embodiments of the disclosure are directed to support rings 600, as shown in FIG. 6. A partial cross-sectional view of the support ring 600 is shown in FIG. 6 in the same orientation as the lower shield 200 and lower shield ring 300 cross-sections. The support ring 600 has a ring-shaped body 602 with an inner face 604 and an outer face 606 defining a width of the support ring 600. A top face 610 and a bottom face 611 define the thickness of the support ring 600. An inner top face 620 extends a length $L_{ITF}$ from the inner face 604 to an inner sloped face 630. The inner sloped face 630 connects the inner top face 620 to the top face 610 so that the thickness of the support ring 600 increases along the length $L_{ISF}$ of the inner sloped face 630 from the inner top face 620 to the top face 610.

In some embodiments, the length of the inner top face 620 is configured to achieve improved edge uniformity. The length of the inner top face 620 can affect the plasma characteristics at the wafer edge. Various lengths can be employed depending on, for example, gas species, bias power and electrical fields at the edge.

In some embodiments, the slope angle 635 of the inner sloped face 630 is adjusted to optimize edge uniformity. Without being bound by any particular theory of operation, it is believed that the slope angle affects the plasma characteristics at the wafer edge. Various slope angles can be employed depending on, for example, gas species, bias power and electrical fields at the edge.

Some embodiments of the support ring 600 include an outer sloped face 640 extending from an outer edge 612 of the top face 610 to the outer face 606 so that the thickness of the support ring 600 decreases from the outer edge 612 of the top face 610 to the outer face 606 along the length $L_{OSF}$ of the outer sloped face 640.

Some embodiments of the disclosure are directed to processing chambers comprising the lower shield, lower shield ring and upper shield described herein. In some embodiments, the lower shield is configured to be connected to a substrate support, the lower shield ring configured to be connected to the lower shield. Some embodiments further comprise a support ring having a ring-shaped body with an inner face and an outer face defining a width of the support ring, a top face, a bottom face, an inner top face extending a length from the inner face to an inner sloped face, the inner sloped face connecting the inner top face to the top face so that a thickness of the support ring increases along a length of the inner sloped face from the inner top face to the top face. In one or more embodiments, an outer sloped face extends from an outer edge of the top face to the outer face so that the thickness of the support ring decreases from the outer edge of the top face to the outer face along the length of the outer sloped face.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A process kit for a processing chamber, the process kit comprising:

a lower shield having a ring-shaped body with an inner wall and an outer wall defining a lower shield wall thickness, the inner wall including a bottom wall, a top wall with an inner ledge having an inner ledge top face, the bottom wall and the inner ledge top face defining a lower shield height, an outer ledge wall extending outwardly forming a lower portion of the outer wall to an outer ledge outer wall, the outer ledge outer wall having a stepped top surface having an outer ledge upper top face and forming an outer ledge lower top face extending from the outer ledge outer wall to an outer ledge intermediate outer wall; and a lower shield ring having a ring-shaped body with an outer wall and a upper inner wall defining a lower shield ring wall thickness, a top face and a bottom face of the upper inner wall defining a thickness of the upper inner wall, a ramped lower inner wall having a top face and a bottom face, the top face of the ramped lower inner wall spaced a distance from the bottom face of the upper inner wall so that the distance decreases from a lower inner wall to an inside surface of the outer wall of the lower shield ring, at least one upper opening extending from the top face of the lower shield ring to the upper inner wall bottom face, and at least one lower opening extending from the top face of the ramped lower inner wall to the bottom face of the ramped lower inner wall, wherein when the ramped lower inner wall of the lower shield ring is in contact with the outer ledge intermediate outer wall of the lower shield, wherein there is an overlap of the lower shield and the lower shield ring, wherein the lower shield height is such that there is horizontal separation extending between the upper inner wall of the lower shield ring at the top face and the top wall of the lower shield defining a gap between the outer wall of the lower shield and the upper inner wall of the lower shield ring, the gap extending to the outer ledge upper top face, and there is a ratio of the overlap of the lower shield and the lower shield ring to the gap between the outer wall of the lower shield and the upper inner wall of the lower shield ring in a range of 5:1 to 10:1.

2. The process kit of claim 1, wherein the inner ledge extends a distance inwardly from an upper portion of the inner wall of the lower shield to an inner ledge face, forming an inner ledge top face and an inner ledge bottom face defining a thickness of the inner ledge.

3. The process kit of claim 2, further comprising a plurality of recesses in the inner ledge top face with a hole extending through the thickness of the inner ledge.

4. The process kit of claim 1, wherein the lower shield ring comprises an inner wall ramp connector face extending from the upper inner wall to the ramped lower inner wall.

5. The process kit of claim 1, wherein the lower inner wall of the ramped lower inner wall has an inner diameter smaller than an inner diameter of the upper inner wall.

6. The process kit of claim 1, wherein the outer ledge lower top face comprises a recess.

7. The process kit of claim 6, wherein the bottom face of the ramped lower inner wall comprises a recess.

8. The process kit of claim 7, wherein the recess in the outer ledge lower top face of the lower shield is spaced a distance from the lower inner wall so that when the lower inner wall is in contact with the outer ledge intermediate outer wall of the lower shield, the recess in the outer ledge lower top face is aligned with the recess in the bottom face of the ramped lower inner wall of the lower shield ring.

9. The process kit of claim 1, wherein the lower shield ring comprises three lower openings extending through the upper inner wall.

10. The process kit of claim 9, wherein there are three lower openings extending through the ramped lower inner wall of the lower shield ring.

11. The process kit of claim 1, further comprising a support ring having a ring-shaped body with an inner face and an outer face defining a width of the support ring, a top face, a bottom face, an inner top face extending a length from the inner face to an inner sloped face, the inner sloped face connecting the inner top face to the top face so that a thickness of the support ring increases along a length of the inner sloped face from the inner top face to the top face, and an outer sloped face extending from an outer edge of the top face to the outer face so that the thickness of the support ring decreases from the outer edge of the top face to the outer face along the length of the outer sloped face.

12. The process kit of claim 11, wherein the bottom face of the ramped lower inner wall contacts the outer ledge lower top face of the lower shield.

13. The process kit of claim 12, wherein a gap between the outer ledge lower top face of the outer ledge and the bottom face of the ramped lower inner wall increases with increasing distance from the ramped lower inner wall to the outer ledge outer wall.

14. The process kit of claim 1, wherein there is at least one opening extending through the thickness of the lower shield ring from the top face to the bottom face.

15. The process kit of claim 11, further comprising an upper shield having a top surface and a bottom surface, an upper shield ring extending from the bottom surface, the upper shield ring having an inside surface and an outside surface defining a thickness of the upper shield ring.

16. The process kit of claim 15, wherein the inside surface of the upper shield ring has an inner diameter greater than an outer diameter of the outer wall of the lower shield.

17. The process kit of claim 15, wherein the thickness of the upper shield ring is smaller than the gap between the outer wall of the lower shield and the upper inner wall of the lower shield ring.

18. The process kit of claim 15, wherein the bottom surface of the upper shield within an inner diameter of the upper shield ring has a contoured shape so that a thickness of the upper shield is greater at a center of the upper shield than at a position in the range of 50% to 90% of the distance between the center of the upper shield and the inner wall of the upper shield ring.

19. The process kit of claim 15, further comprising a grounding ring having an inner diameter greater than an outer diameter of the upper shield ring and a top surface configured to connect to the bottom surface of the upper shield ring outside the outer diameter of the upper shield ring.

* * * * *